United States Patent [19]

Kawashima

[11] Patent Number: 5,654,605
[45] Date of Patent: Aug. 5, 1997

[54] HARDWARE ARRANGEMENT AND METHOD OF DRIVING A PIEZOELECTRIC TRANSFORMER

[75] Inventor: Shingo Kawashima, Tokyo, Japan

[73] Assignee: NEC Corporation, Tokyo, Japan

[21] Appl. No.: 539,787

[22] Filed: Oct. 5, 1995

[30] Foreign Application Priority Data

Oct. 5, 1994 [JP] Japan .................................. 6-241049

[51] Int. Cl.[6] .................................................. H01L 41/08
[52] U.S. Cl. .................................................. 310/316; 310/318
[58] Field of Search ............................... 310/316–319, 310/359, 366

[56] References Cited

U.S. PATENT DOCUMENTS

| 4,459,505 | 7/1984 | Lim | 310/318 |
|---|---|---|---|
| 5,329,200 | 7/1994 | Zaitsu | 310/316 |
| 5,341,061 | 8/1994 | Zaitsu | 310/318 |
| 5,394,048 | 2/1995 | Yamashita et al. | 310/316 |

FOREIGN PATENT DOCUMENTS

| 61-152165 | 7/1986 | Japan . |
|---|---|---|
| 4-49846 | 2/1992 | Japan . |
| 4-133657 | 5/1992 | Japan . |
| 5-219730 | 8/1993 | Japan . |

*Primary Examiner*—Mark O. Budd
*Attorney, Agent, or Firm*—Sughrue, Mion, Zinn, Macpeak & Seas

[57] ABSTRACT

An apparatus for controlling a piezoelectric transformer is disclosed. A transformer driver (12) supplies the transformer with a driving voltage the frequency of which is controlled by a frequency oscillator (18). A load current monitor (20, 22, 24, 26) observes a load current flowing through a load such as a fluorescent which is powered by said transformer. A frequency sweep controller (16) controls the frequently oscillator, when the transformer is initially energized, so as to execute a downward frequency sweep wherein the frequency of the driving voltage is swept from a predetermined upper frequency to a predetermined lower frequency. The frequency sweep controller further controls the frequency oscillator, after the transformer has been brought into stable operation, so as to execute the downward frequency sweep when the load current reduces to a second preset level lower than the first preset level.

15 Claims, 7 Drawing Sheets

1

HARDWARE ARRANGEMENT AND METHOD OF DRIVING A PIEZOELECTRIC TRANSFORMER

BACKGROUND OF THE INVENTION

1. Field of the Invention

The present invention relates generally to improvements of a power source which utilizes a piezoelectric transformer, and more specifically to a hardware arrangement and method of effectively driving a piezoelectric transformer which provides a load with a high ac (alternate current) voltage. The present invention is well suited for use with a cold cathode fluorescent lamp provided in a backlit display of a notebook type computer, however, is in no way limited to such usage.

2. Description of the Related Art

In order to reduce a size of a power source used for providing a high ac voltage, it has been proposed to employ a piezoelectric transformer in place of a conventional electromagnetic-type transformer. When a piezoelectric transformer is used in a power source for generating a high ac voltage, it is known to use a feedback control loop to attain stable operations of the device. By way of example, such prior techniques are disclosed in Japanese Laid-open Patent Applications Nos. 61-152165, 4-49846, 4-133657, and 5-219730.

These known techniques disclose various feedback techniques for controlling a driving frequency in response to output voltage and/or current of the transformer. However, it is necessary to ensure stable energization of the piezoelectric transformer when it is initially put into operation. Further, it is very important to prepare for undesirable occurrences which can be encountered while the transformer is operating normally. For example, it is necessary to restore stable operation of the transformer when a load current decreases due to an unexpected reduction of the main dc voltage of a system. Still further, it is very important to prevent the piezoelectric transformer from damaged when the transformer is accidentally disconnected from a load while operating in a stable mode.

SUMMARY OF THE INVENTION

It is an object of the present invention to provide an arrangement for effectively driving a piezoelectric transformer.

Another object of the present invention is to provide a method of effectively driving a piezoelectric transformer.

More specifically, a first aspect of the present invention resides in an apparatus for driving a piezoelectric transformer which supplies a load with a high ac (alternate current) voltage, comprising: a driver coupled to said piezoelectric transformer for driving said piezoelectric transformer; a frequency oscillator for generating a driving frequency which is applied to said driver; a frequency sweep controller for controlling said frequency oscillator such as to sweep said driving frequency from an upper frequency to a lower frequency at least when said piezoelectric transformer is initially energized; a frequency oscillator controller provided in a feedback loop between said load and said frequency oscillator controller, said frequency oscillator controlling said frequency oscillator; and means for detecting a load current flowing through said load and checking to determine if said load current exceeds a first preset level while said frequency oscillator sweeps said driving frequency, wherein said frequency oscillator controller initiates control of said frequency oscillator when said means detects that said load current exceeds said first preset level.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first preferred embodiment of the present invention is discussed with reference to FIGS. 1–4.

Figure 1:
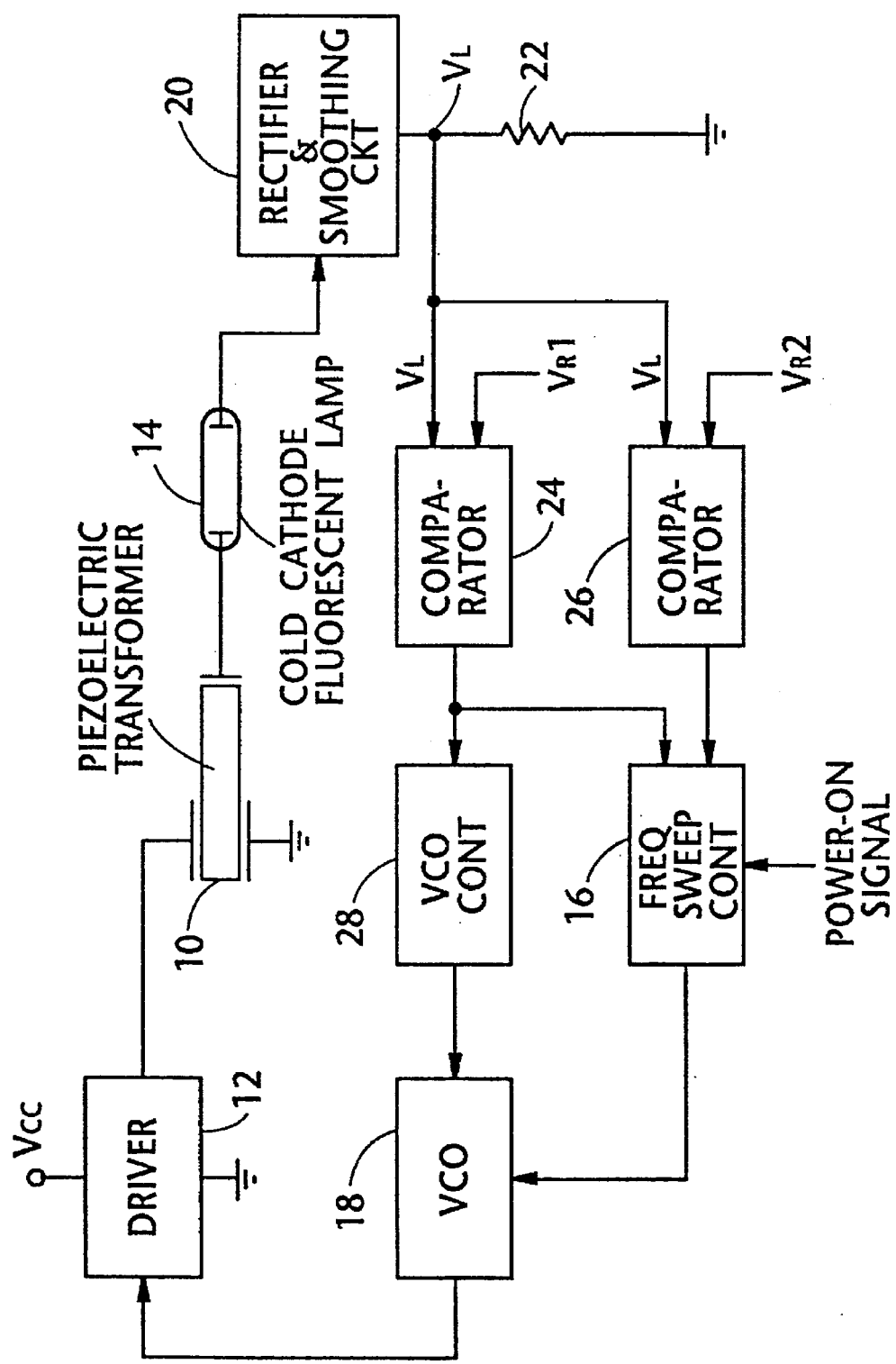
FIG. 1 is a block diagram showing a first embodiment of the present invention.

FIG. 1 is a block diagram schematically showing a piezoelectric transformer driving arrangement operatively coupled to a load. As shown, a piezoelectric transformer 10 is directly driven by a transformer driver 12 and supplies a cold cathode fluorescent lamp (viz., load) 14 with a high ac voltage. As is known in the art, the driver 12 is provided to amplify an ac (alternate current) driving voltage to an appropriate voltage which depends on physical dimensions of a piezoelectric transformer to be driven.

Figure 2:
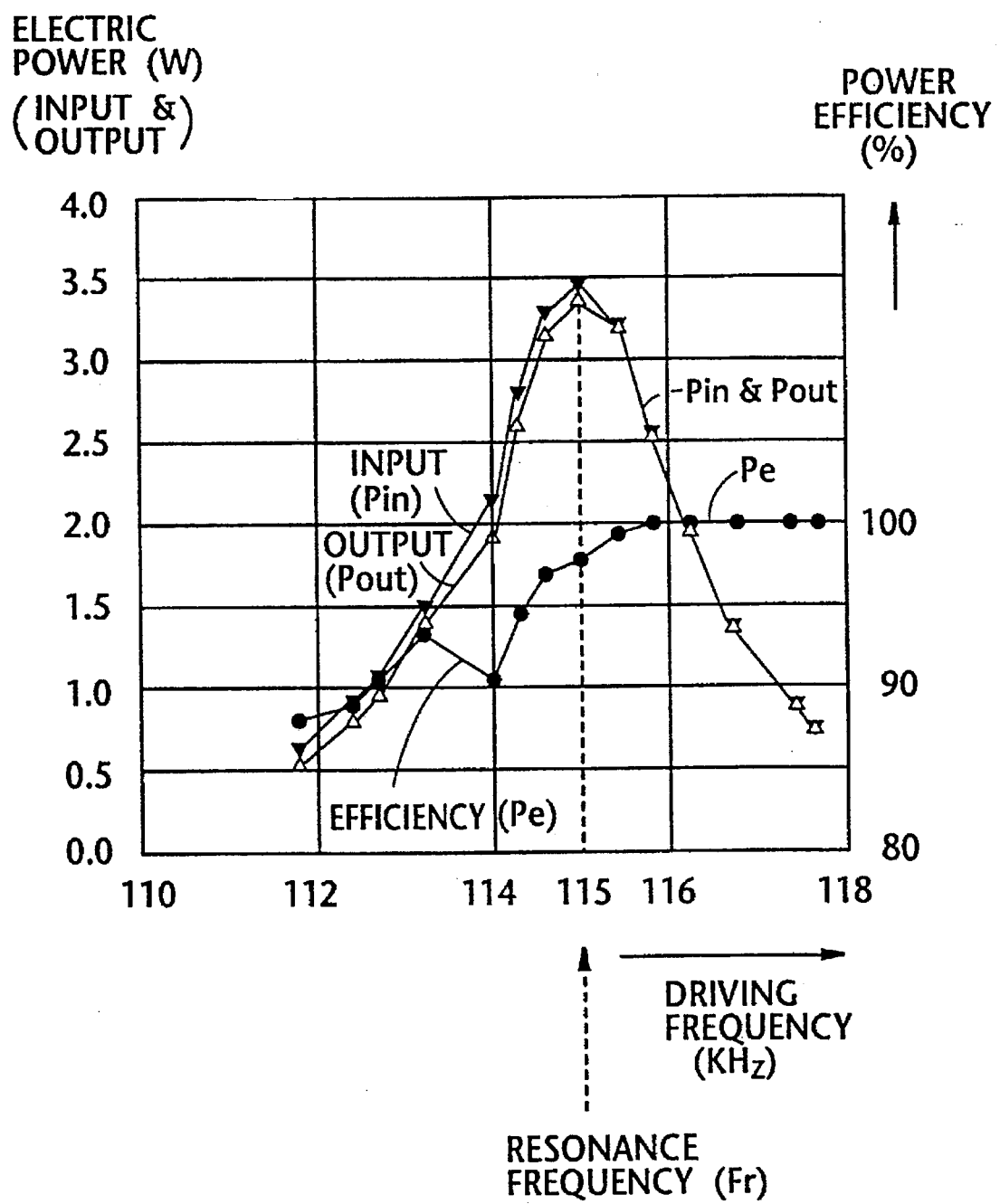
FIG. 2 is a graph showing a relationship between input and output electric power of a piezoelectric transformer in the vicinity of a resonance frequency of the transformer.

Prior to discussing the arrangement of FIG. 1, reference is made to FIG. 2. FIG. 2 is a graph showing power efficiency (depicted by trace Pe) of the piezoelectric transformer 10 when it is driven with a frequency ranging from below 112 KHz to above 118 KHz. In this case, it is assumed that the transformer 10 is coupled to the fluorescent lamp 12. A resonance frequency (depicted by Fr) of the transformer 10 is assumed to be 115 KHz whereat input and output electric power (depicted respectively by Pin and Pout) takes a value in the vicinity of 3.4 W (watt) in this particular case. FIG. 2 graphically shows that the power efficiency Pe (viz., Pout/Pin) assumes high in the frequency range above and close to the resonance frequency Ft. It is therefore highly advisable to drive the piezoelectric transformer 10 in such a frequency range (viz., above and closed to the resonance frequency Fr).

According to the present invention, a load current flowing through the lamp 12 when the transformer 10 operates in a stable state is determined so as to be at a transformer driving frequency above and close to the resonance frequency Fr. To this end, when the piezoelectric transformer 10 is initially driven, the driving frequency applied to the transformer 10 is swept from a predetermined maximum frequency toward a predetermined minimum frequency. Further, the desirable load current is set to 5 mA which corresponds to the driving frequency at about 116 KHz. As shown in FIG. 4, it is assumed that the maximum and minimum frequencies are respectively 130 KHz and 100 KHz merely by way of example. In other words, the above mentioned downward frequency sweep is to establish a desirable load current at a driving frequency above and close to the resonance frequency (Fr)(see FIGS. 3 and 4).

Returning to FIG. 1, when the piezoelectric transformer 10 is initially energized, a frequency sweep controller 16 receives a power-on signal from an external circuit (not shown) which requires energization of the fluorescent lamp 14. The controller 16, in response to the power-on signal, applies a control signal to a voltage controlled oscillator (VCO) 18 in a manner to allow the VCO 18 to generate the transformer driving frequency which is linearly reduced from 130 KHz toward 100 KHz (viz., implements frequency-down sweep). The voltage of the transformer driving frequency is appropriately amplified and applied to the transformer 10 which in turn applies the high ac output voltage to the fluorescent lamp 14. The vibration mechanism of a piezoelectric transformer is well known in the art and thus the details thereof are omitted for brevity.

The current flowing through the fluorescent lamp 14 is rectified and then smoothed at a rectifier/smoothing circuit 20 and exhibits a voltage $V_L$ at one terminal of a voltage divider 22. The voltage $V_L$ is then compared with a reference voltage $V_R1$ at a comparator 24. The reference voltage $V_R1$ corresponds to the above mentioned desirable load current (3 mA for example). The voltage $V_L$ is also compared with another reference voltage $V_R2$ at a comparator 26 whose output (viz., comparison result), however, is neglected at the frequency sweep controller 16 at this stage as discussed later.

Figure 3:
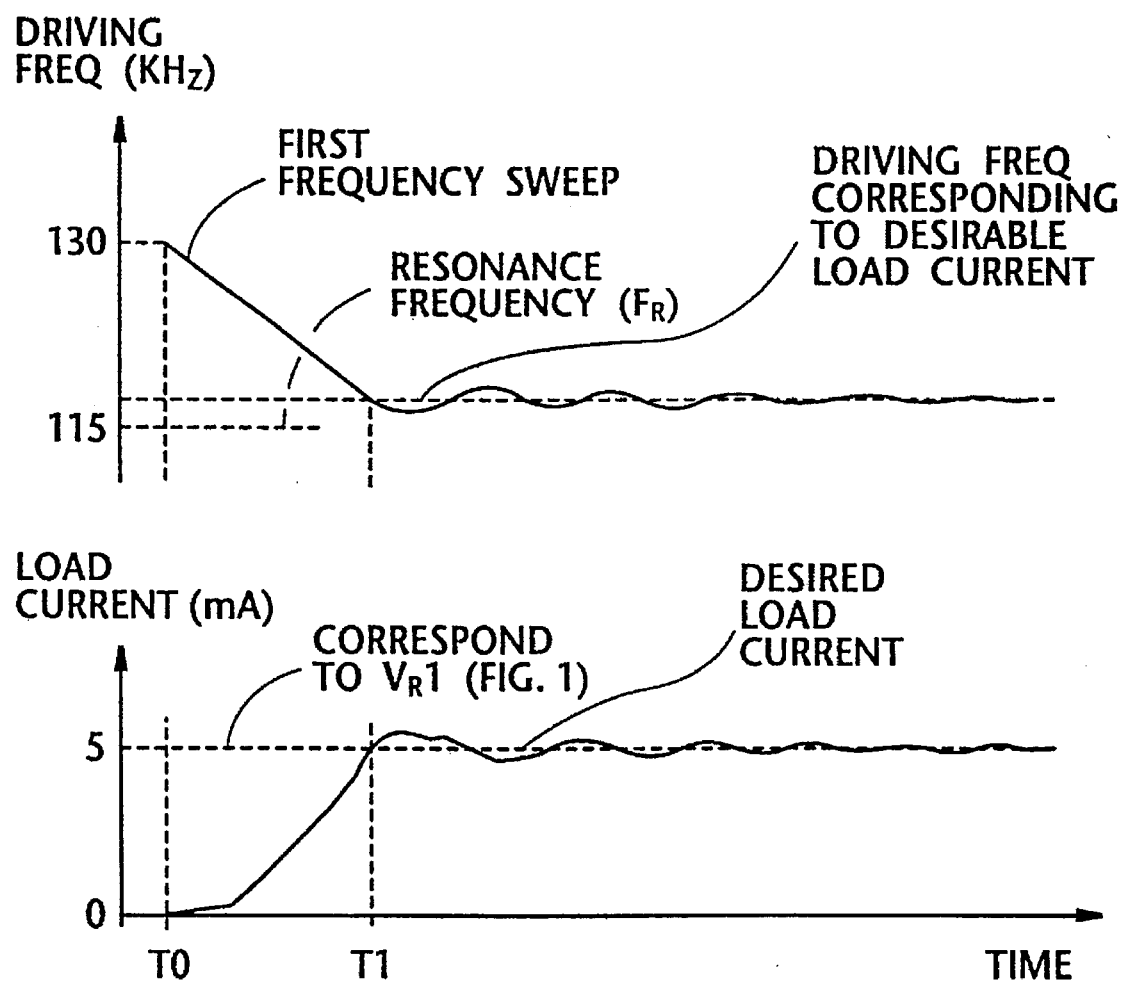
FIG. 3 is a diagram showing a manner wherein a load current is converged, during a first frequency sweep operation, to a desired value when the arrangement of FIG. 1 is initially energized.
Figure 4:
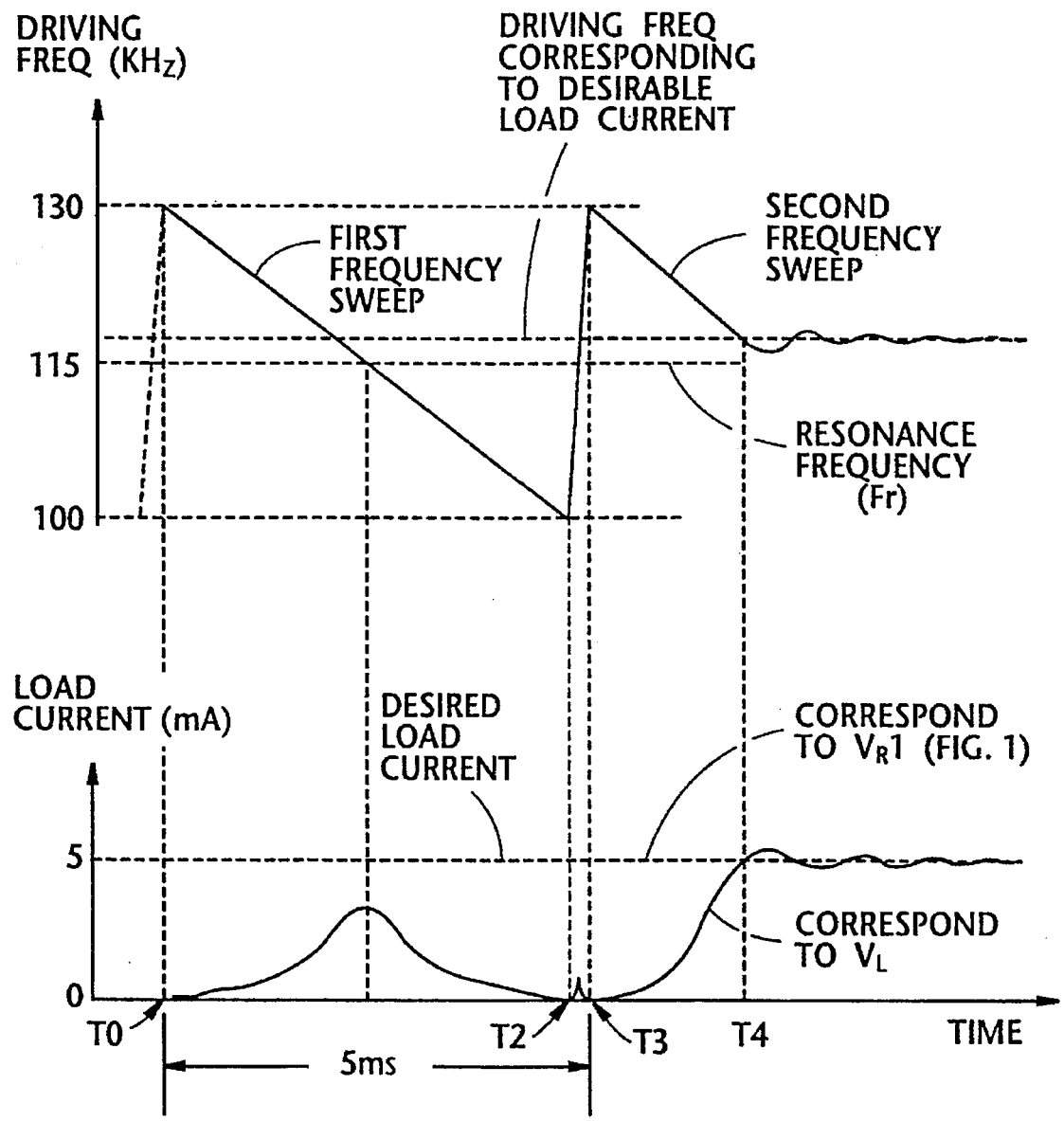
FIG. 4 is a diagram showing a manner wherein a load current is converged, during a second frequency sweep operation, to a desired value when the arrangement of FIG. 1 is initially energized.

As shown in FIG. 3, after the transformer 10 is initially energized at a time point T0, if the voltage $V_L$ exceeds the reference voltage $V_R1$ at a time point T1 in the initial frequency sweep cycle, the comparator 24 issues a logic 1 (for example) which is applied to both the frequency sweep controller 16 and a VCO controller 28. In such a case, the frequency sweep controller 16 prohibits the VCO 18 from continuing the remainder of the first frequency sweep operation. On the other hand, the VCO controller 28 controls the VCO 18 so as to slightly increase the driving frequency. In other words, after the time point T1, the VCO controller 28 controls the VCO 18 in a manner to converge the voltage $V_L$ to the reference voltage $V_R1$. This feedback operation is well known in the art.

On the other hand, as shown in FIG. 4, if the voltage $V_L$ fails to develop such as to exceed the reference voltage $V_R1$ during the first frequency sweep from T0 to T2, the comparator 24 does not issue a logic 1 during the first frequency sweep. The frequency sweep controller 16 senses this situation and rapidly changes the driving frequency from the minimum value (100 KHz) to the maximum one (130 KHz) between time points T2 and T3. Following this, a second frequency sweep operation is initiated at the time point T3. As shown in FIG. 4, the voltage $V_L$ exceeds the reference voltage $V_R1$ at a time point T4 during the second frequency sweep operation. The operations of the two controllers 16 and 28 following the time point T4 have already been described in connection with FIG. 3.

Once the fluorescent lamp 14 is energized and becomes stably illuminated, the current flowing through the lamp 14 (load current) is maintained at substantially a constant current (3 mA for example in this embodiment). However, the load current may undesirably decrease due to lowering of dc power voltage supplied from external circuit (not shown). According to the present invention, after the lamp 14 has been brought into stable operation, the comparator 26 constantly checks to determine if the voltage $V_L$ lowers below a reference voltage $V_R2$ which is lower the reference voltage $V_R1$. When $V_L < V_R2$ the comparator 26 issues a logic 1. The frequency sweep controller 16 responds to this logic 1 and instructs the VCO 18 to again implement the above mentioned downward frequency sweep operation which has been discussed with reference to FIGS. 3 and 4. If the power voltage restores the normal value thereof before the first or one of the successive frequency sweep operations, the load current increases up to the predetermined value (viz., the desirable load current) whereby lamp 14 is again brought into normal operation.

If the aforesaid frequency sweep is not carried out (viz., if the comparator 26 is not provided), the arrangement of FIG. 1 encounters the following difficulty. That is, as mentioned above, the driving frequency is maintained above the resonance frequency (Fr) while the lamp 14 normally operates. Thus, when the load current falls below the predetermined level (3 mA) (viz., the voltage $V_L$ falls below the reference level $V_R2$), the VCO controller 28 responds in a manner which decreases the driving frequency in an attempt to increase the load current. However, it is not possible to successfully raise the load current in that the power voltage has now been lowered. Therefore, the driving frequency is eventually lowered to the minimum frequency (100 KHz) and stays thereat. This means that even if the power voltage is restored to the normal value, the transformer 10 is unable to be driven by the predetermined driving frequency above the resonance frequency (Fr).

Figure 5:
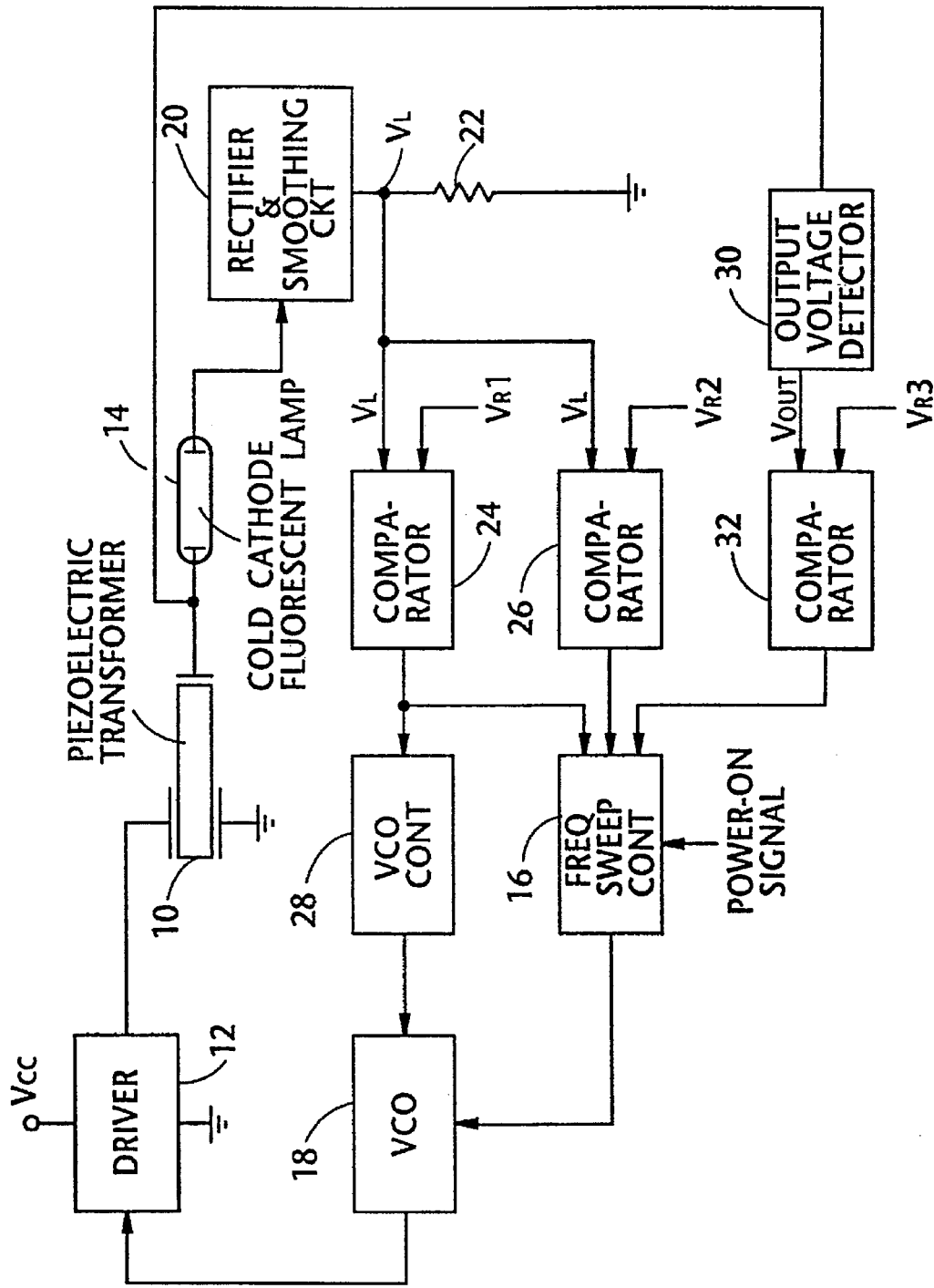
FIG. 5 is a block diagram showing a second embodiment of the present invention.

Referring to FIG. 5, a second embodiment of the present invention is shown in block diagram form.

The second embodiment differs from the first embodiment (FIG. 1) in that the former embodiment further includes an output voltage detector 30 and a comparator 32. The blocks of FIG. 5 which have been described in connection with FIGS. 1–4 are not referred to for the sake of simplifying the disclosure. The detector 32 is coupled to detect the output voltage of the piezoelectric transformer 10, while a comparator 32 is arranged to compare a detected output voltage rout with a reference voltage $V_R3$. The comparison result of the comparator 32 is applied to the frequency sweep controller 16.

The second embodiment provides means for effectively preventing the transformer 10 from being seriously or even irrecoverably damaged by excessive vibration which tends to be induced when the output voltage abruptly increases. Such an abnormal increase of the transformer's output voltage occurs when the transformer's output is accidentally open due to unintentional disconnection between the transformer 10 and the fluorescent lamp 14 (for example). More specifically, the comparator 32 constantly compares the reference voltage $V_R3$ with the voltage Vout which is proportional to the output voltage developed at the output terminal of the transformer 10. It goes without saying that the reference voltage $V_R3$ is empirically determined depending on the transformer used.

Figure 6:
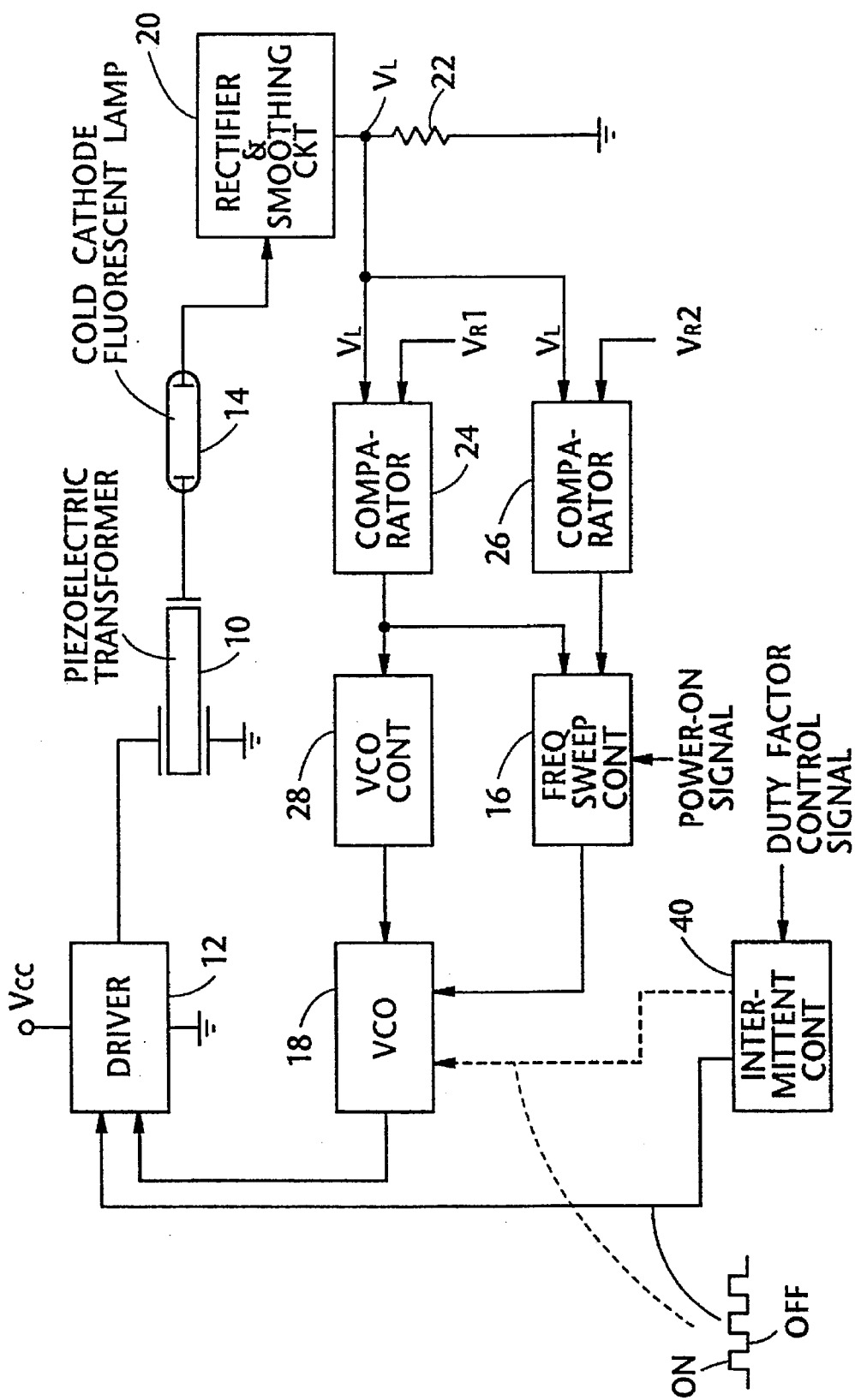
FIG. 6 is a block diagram showing a third embodiment of the present invention.

FIG. 6 is a block diagram showing a third embodiment of the present invention. A difference between the first and third embodiments is that the third embodiment further includes a drive frequency intermittent controller 40. The remaining portions of the third embodiment are identical to the arrangement of the first embodiment and thus the descriptions thereof are not given for brevity.

The controller 40 is provided with a pulse generator (not shown) which issues a train of pulses of 200 Hz (for example). Each duty factor of the pulses is controllable by a duty factor control signal applied to the controller 40 from external circuitry (not shown). The controller 40 controls the driver 12 such as to allow the driving frequency to be applied to the transformer 10 while each pulse exhibits a high level (ON). On the other hand, the controller 40 controls the driver 12 so as to prevent the driving frequency from being applied to the transformer 10 while each pulse exhibits a low level (OFF). Thus, the average output electric power of the transformer 10 can be adjusted by adjusting the duty factor of each pulse. This means that the brightness of the lamp 14 can be controlled.

When the third embodiment is applied to a backlit display of a notebook type computer, a user is able to adjust the contrast of the display by controlling backlight behind a liquid crystal display (LCD) (viz., by controlling the duty factor) using a suitable electric component such as a volume control which is included in the above mentioned external circuitry.

When the third embodiment is applied to a backlit display which is driven by vertical sync (synchronization) frequency of 59.94 Hz (in the case of NTSC (National Television System Committee) standards for television and video), the pulse frequency should not be permitted to approach an integer multiple of the vertical synchronization frequency. This is very important in order to avoid undesirable visible phenomena such as Moiré patterns, flickering, etc. induced by interference between the pulse frequency and the vertical sync frequency. The same discussion applies to the PAL or SECAM standards wherein the vertical sync frequency is 50.00 Hz.

According to the experiments conducted by the inventor, it is highly preferable to limit the pulse frequency within ±10 Hz of an integral multiple of the vertical sync frequency.

In the above, the intermittent controller 40 controls the periodic blockage of the driving frequency to the transformer. As an alternative, the controller 40 may be coupled to the VCO for intermittently prohibiting the generation of the driving frequency per se.

Figure 7:
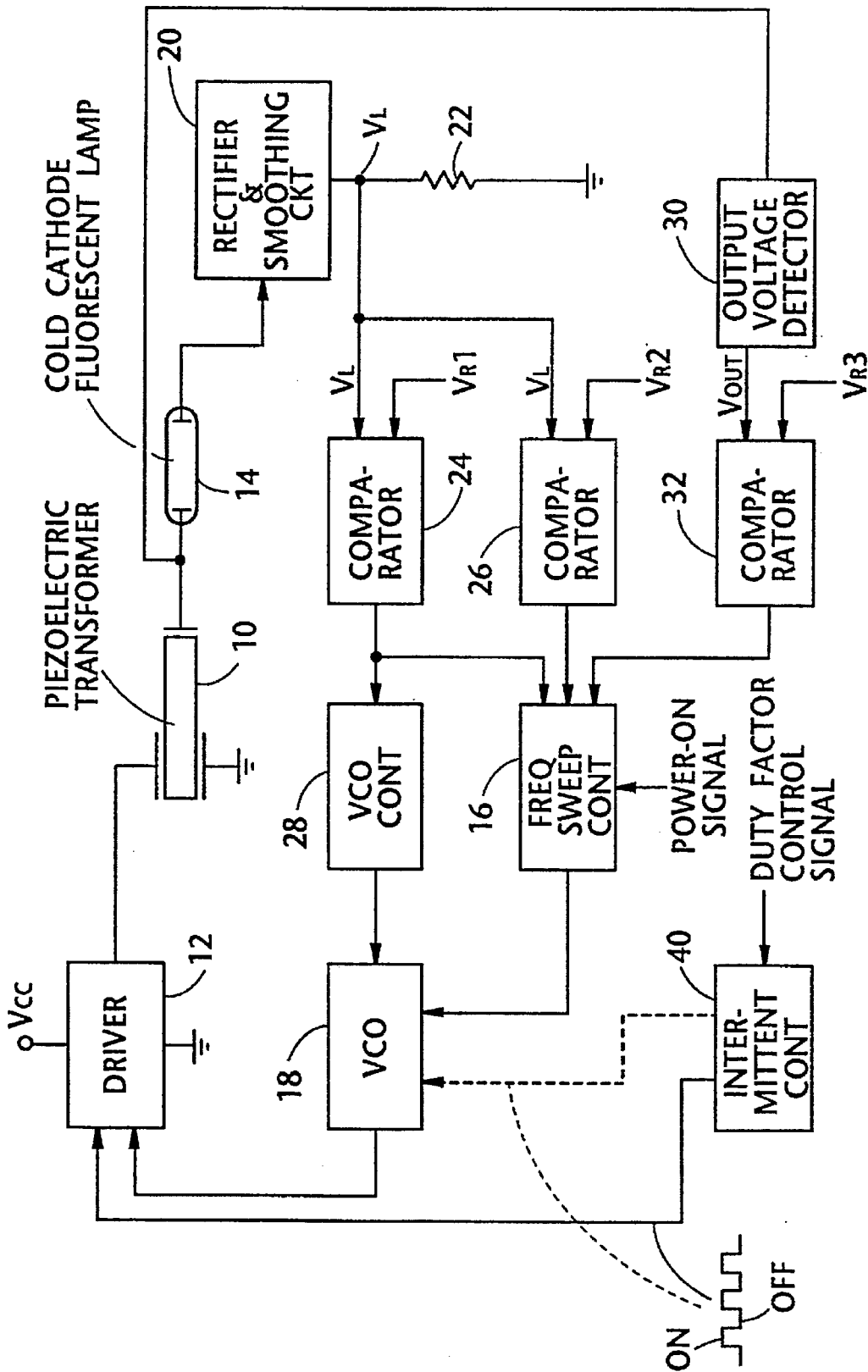
FIG. 7 is a block diagram showing a fourth embodiment of the present invention.

FIG. 7 is a block diagram showing a fourth embodiment of the present invention. The fourth embodiment is constructed by combining the second and third embodiment and thus, the operations of the fourth embodiment are readily understood from the foregoing discussion.

It will be understood that the above disclosure is representative of only four possible embodiments of the present invention and that the concept on which the invention is based is not specifically limited thereto.

What is claimed is:

1. An apparatus for controlling a piezoelectric transformer comprising:

driver means for applying a driving voltage to said piezoelectric transformer;

frequency oscillator means for controlling a frequency of said driving voltage;

means for monitoring the load current flowing through a load which is powered by said piezoelectric transformer; and frequency control means for controlling said frequency oscillator means when said piezoelectric transformer is initially energized so as to execute a downward frequency sweep, wherein the frequency of said driving voltage is swept from a predetermined upper frequency to a predetermined lower frequency, said frequency control means further controlling said frequency oscillator means, after said piezoelectric transformer has been brought into stable operation so as to execute said downward frequency sweep when the load current reduces to a second preset level lower than said first preset level.

2. An apparatus as claimed in claim 1, further comprising means for controlling the frequency of said driving voltage so as to converge to a preset frequency when said load current exceeds a first preset level.

3. An apparatus as claimed in claim 1 or 2, wherein said load is a fluorescent lamp.

4. An apparatus as claimed in claim 1 or 2, wherein said first preset level is above and close to a resonance frequency of said transformer.

5. An apparatus as claimed in claim 1 or 2, further comprising:

means for detecting an output voltage of said transformer;

means for monitoring said output voltage; and wherein said frequency control means reduces the frequency of said driving voltage down to said predetermined lower frequency when said output voltage exceeds a preset voltage.

6. An apparatus as claimed in claim 5, wherein said load is a fluorescent lamp.

7. An apparatus as claimed in claim 5, wherein said first preset level is above and close to a resonance frequency of said transformer.

8. An apparatus as claimed in claim 1 or 2, further comprising means for controlling either said driver means or said frequency oscillator means so as to intermittently drive said transformer.

9. An apparatus as claimed in claim 8, wherein said load is a fluorescent lamp.

10. An apparatus as claimed in claim 8, wherein said first preset level is above and close to a resonance frequency of said transformer.

11. An apparatus as claimed in claim 8, wherein a frequency for intermittently driving said transformer is not permitted to approach an integer multiple of a vertical synchronization frequency for television and video.

12. An apparatus as claimed in claim 5, further comprising means for controlling either said driver means or said frequency oscillator means so as to intermittently drive said transformer.

13. An apparatus as claimed in claim 12, wherein said load is a fluorescent lamp.

14. An apparatus as claimed in claim 12, wherein said first level is above and close to a resonance frequency of said transformer.

15. An apparatus as claimed in claim 12, wherein a frequency for intermittently driving said transformer is not permitted to approach an integer multiple of a vertical synchronization frequency for television and video.

* * * * *